United States Patent [19]

Karp et al.

[11] Patent Number: 4,971,856
[45] Date of Patent: Nov. 20, 1990

[54] MICROWAVE COMPONENTS WITH A SURFACE COATING WHICH IMPARTS A VERY HIGH RF LOSS

[76] Inventors: Arthur Karp, 1470 Sand Hill Rd., Palo Alto, Calif. 94304; Arthur E. Schoennauer, 586 Military Way, Palo Alto, Calif. 94306

[21] Appl. No.: 218,005

[22] Filed: Jul. 12, 1988

Related U.S. Application Data

[63] Continuation-in-part of Ser. No. 47,242, May 7, 1987, abandoned.

[51] Int. Cl.⁵ ............................................... B32B 9/00
[52] U.S. Cl. ..................................... 428/209; 428/210; 428/323; 428/901
[58] Field of Search ................. 428/209, 210, 323, 901

[56] References Cited

U.S. PATENT DOCUMENTS

| | | | |
|---|---|---|---|
| 3,590,468 | 7/1971 | Buck | 29/473.1 |
| 3,955,034 | 5/1976 | Fletcher et al. | 428/332 |
| 3,982,048 | 9/1976 | Zlupko | 427/126 |
| 4,218,507 | 8/1980 | Deffeyes et al. | 428/328 |
| 4,352,716 | 10/1982 | Schaible et al. | 156/643 |
| 4,630,566 | 12/1986 | Asmussen et al. | 118/50.1 |
| 4,639,391 | 1/1987 | Kuo | 428/210 |
| 4,673,456 | 6/1987 | Spencer et al. | 156/345 |
| 4,673,958 | 6/1987 | Bayrakcaroglu | 357/13 |
| 4,817,276 | 4/1929 | Toda et al. | 29/830 |

FOREIGN PATENT DOCUMENTS 0290148  5/1987  European Pat. Off. .

*Primary Examiner*—Patrick Ryan
*Attorney, Agent, or Firm*—Venable, Baetjer, Howard & Civiletti

[57] ABSTRACT

To selectively and controllably increase RF surface power loss in microwave components, the component surfaces are overcoated with a suspension of conductive particles in a viscous binder of thickness less than a wavelength at the operating frequency. The binder is compounded so as to fire to a glassy matrix that is a durable, heat-resistant and vacuum-compatible dielectric. The metal particle size, which is selected to fit within the coating thickness, is preferably large compared with the RF skin depth of the conductive particles, but no smaller than one-quarter skin depth.

16 Claims, 2 Drawing Sheets

FIG._4
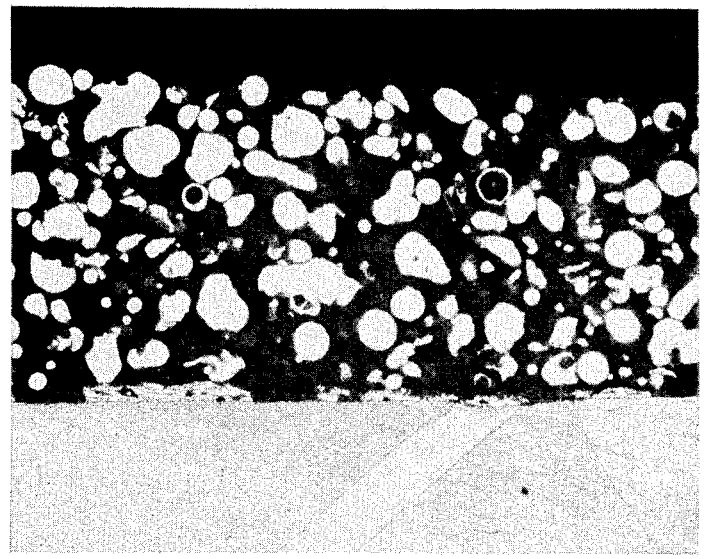
FIG.5A
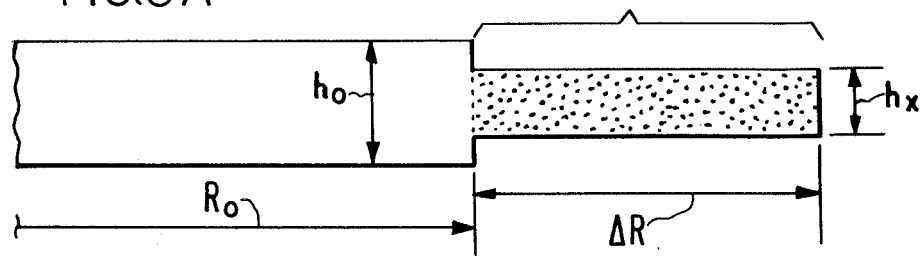
FIG.5B
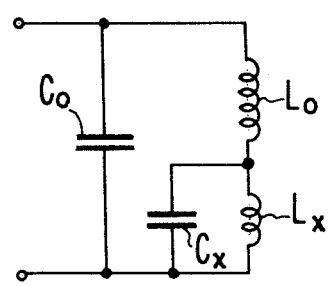

MICROWAVE COMPONENTS WITH A SURFACE COATING WHICH IMPARTS A VERY HIGH RF LOSS

CROSS-REFERENCE TO RELATED APPLICATION

This application is a continuation in part of U.S. Serial No. 047,242 filed May 7, 1987 now abandoned.

FIELD OF THE INVENTION

This invention pertains to a structure and method of forming a coating on microwave components so as to introduce a substantial and controllable RF power loss.

BACKGROUND OF THE INVENTION

In the manufacture of cavity resonators, periodic propagating structures and other waveguide components for microwave tubes of various types, or for other microwave devices, the copper usually chosen to ensure thermal conductivity is too good an RF electrical conductor for some purposes. This is the case when the cavity Q desired for optimum performance is much lower than the Q obtained with copper alone, or when the RF loss along a periodic structure or waveguide needed for device stability or to create a termination or mode filter is much grater than copper alone would provide. It accordingly becomes necessary to modify the cavity or waveguide, so that Rf power will be absorbed to a much greater degree than without the modification. In a coupled-cavity TWT, for example, it can be necessary to reduce cavity Q by a factor of several hundred at about 3 GHz, or by a factor of 40 to 80 at about 10 GHz.

A parameter called loss index is defined as the factor by which the Q of a cavity would be divided if the entire copper surface were coated. Loss index therefore is the same as the coating's effective surface resistivity in ohms per square, normalized to that of copper at the same frequency. Since the surface resistivity of copper itself varies with frequency, any change in loss index with frequency would be superposed on the change for bare copper to arrive at the coating's net surface resistivity at another frequency. As defined, the loss index of smooth, solid metals and metal alloys, in a layer thicker than a skin depth, should not vary with frequency, but it might well do so for porous or composite materials or very thin films. When it's not practical to coat the entire copper cavity interior, then the coating's loss index must exceed the factor by which the cavity Q is required to be divided.

To date a very popular coating has been a flame-or arc-sprayed layer of the alloy Kanthal A-1, fed into the flame or arc as a rod or wire. The main constituents of Kanthal A-1 are iron and chromium, in about the same proportion as in Type 430 stainless steel, and aluminum. Because of the aluminum oxide formed in the spraying of molten Kanthal, adhesion to the copper can be uncertain. The best chances for adhesion are when an undercoat of dendritic copper is applied in a prior operation. Recent research has quantified the factors contributing to the high loss index of this coating. (See: A. Karp, Microwave Physics of Flame-Sprayed Kanthal and Other Circuit Loss Coatings, 1985 IEDM TEchnical Digest, IEEE, pp. 354–6.) The primary factor is the alloy's high intrinsic resistivity (81 times that of copper for DC purposes but 9 times for RF purposes). The 2nd most important factor comes from the square root of the magnetic permeability that is effective at the frequency of interest (e.g., a multiplier factor measured to be 2.8 at 10 GHz). A 4th and rather minor factor is due to the roughness of the coating's surface. However, the third factor is non-trivial, and it comes from the fact that the coating is not solid, but an aggregation of metal blobs stuck together, it is believed, by ultrathin films of vitreous aluminum oxide fluxed with traces of the oxides of the other metals in the alloy (iron, chromium, cobalt).

Many of these factors can vary because of differences in operator technique. The coating thickness, which is large enough to weigh in cavity design, is also subject to variation. The highest observed loss indices for such coatings is around 50–55, which is sufficient for many past applications, but inadequate for many others and for some future ones.

Another commonly used coating is a sintered-on layer of iron spherules. This can be made quite thin, as is required for millimeter-wave applications, because the spherules are only a few microns in diameter, which is the result of preparing them via the Carbonyl process. However the intrinsic resistivity of iron is only 5.6 times that of copper for DC purposes or 2.37 times for RF purposes. The effective magnetic permeability, even at microwave frequencies, should be relatively high, but carbon impurity resulting from the Carbonyl process is detrimental to this permeability. The sponginess of the sintered-spherule layer is important to the overall loss index, but the layer becomes more compacted each time the assembly gets hydrogen fired in the course of tube construction. The nature of iron makes this unavoidable for both anhydrous (dry) and humidified (wet) hydrogen firing. The coating can also act as a wick in proximity to any molten braze alloy; when this occurs, loss is no longer obtained. Certain additives are helpful in preventing these problems but incur processing costs. Overall loss indices ranging from 15 to 23 have been measured at 10 GHz. This might be sufficient for some millimeter-wave requirements provided the index didn't decrease in the course of tube manufacture; other millimeter-wave applications require higher loss.

Certain coatings are used to metallize ceramics. However these metallizing coatings cannot be considered as loss coatings. The metal is typically molybdenum, a nonmagnetic, highly conductive metal, and it is very finely ground for the purpose. These factors all help make the effective loss index quite low. When this kind of coating is fused onto ceramic, a composition gradient develops so that the coating is mostly glass at the ceramic interface and almost entirely metal at the opposite surface. The coating of the present invention, however, is fused onto a metal substrate whereby no such composition gradient develops. Moreover the ceramic-metallizing coatings are fused at over 1200° C., which is too high a temperature for copper parts.

There are schemes for lowering cavity Q, the ultimate objective, that do not use wall coatings, but instead use chunks or buttons of high-loss dielectric. Whereas the wall coatings interact with RF wall currents (or RF H-fields near the wall), the dielectric inserts interact with RF E-fields well inside the cavity. The material is typically ceramic infiltrated with carbon or containing some very finely powdered silicon carbide. The inserts tend to be large, expensive and hard to cool. The Anisotropy and nonreproducibility may cause problems. However, they have to date been the only available route to achieving the very large Q reduction factors required for S- and C-band cavity tubes.

OBJECTS OF THE INVENTION

An object of the invention is to provide an inexpensive, vacuum compatible, durable, thin coating that can be conveniently applied to surfaces of copper or other metal substrate to increase the rate of RF power absorption by a large factor in a manner that is also controllable and reproducible.

SUMMARY OF THE INVENTION

These objects of the invention and other objects, features and advantages to become apparent as the specification progresses are accomplished by the invention according to which, briefly stated, the copper or conductive metal surface is coated with a suspension of conductive particles in a viscous binder. The particle size is such that the size of each particle is preferably larger than the RF skin depth at the frequency of use, but no less than about one-quarter skin depth. The thickness of the resulting coating is less than a wavelength. The binder is fired to a glass. The surface of the copper will have been previously coated with a thin oxidizable metal to provide the adhesion of the glass matrix. The resulting coating is reproducible, can be tailored to the desired loss characteristic and is machinable. It is also vacuum compatible and resists heat and thermal shock.

These and further constructional and operational characteristics of the invention will be more evident from the detailed description given hereinafter with reference to the figures of the accompanying drawings which illustrate one preferred embodiment and alternatives by way of non-limiting examples.

BRIEF DESCRIPTION OF THE DRAWINGS

FIG. 4 is a metallurgical cross-sectional micrograph of the coating according to the invention using "325 Mesh" globular Nichrome V particles and glass. The thickness of the coating is about 0.010 inch or 0.25 mm. The base is copper. note the thin interface layer of stainless steel between the copper and top coating. The dark color between metal blobs is part voids and part glass.

FIG. 5 is a diagram of the equivalent circuit of a region near the rim of the cavity slice of FIG. 3.

DETAILED DESCRIPTION OF THE PREFERRED EMBODIMENTS

Figure 1:
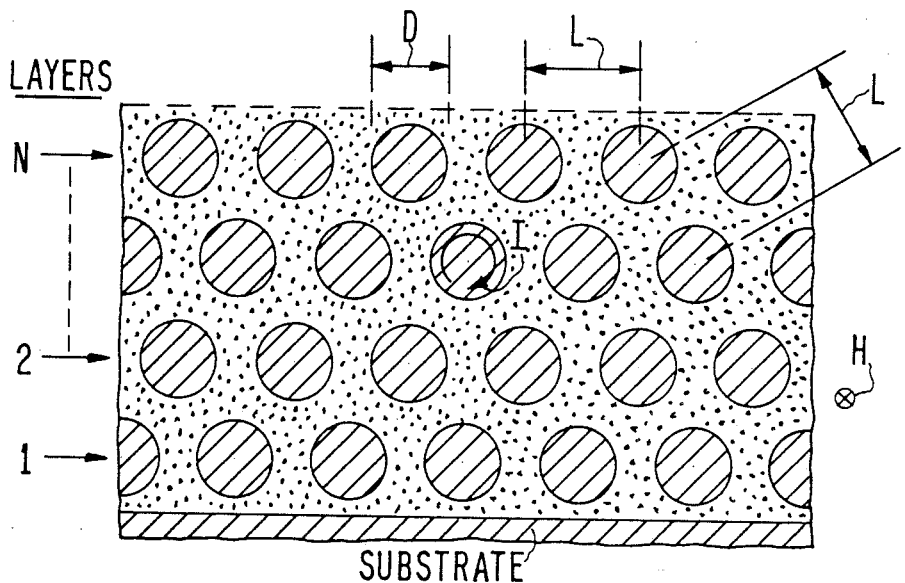
FIG. 1 shows an idealized section of the coating according to the invention in a plane normal to the RF H-field.

The coatings of the invention consist in one preferred embodiment of metal-alloy particles and powdered glass-forming oxides or fritted selected to fuse at 1040° C., for example. Oxides of manganese, silicon, boron and aluminum have been combined to date, in that order of importance by weight, but the invention isn't necessarily limited to this mixture for the glaze or glass component of the coating. The compounding of oxides that will melt into a glaze or glass around a predetermined temperature is well known to those familiar with glazing art, except that, for compatibility with a thermionic vacuum tube, elements such as sodium should not be included. The subject of this invention is thus not glaze or glassy-enamel coatings, but coatings containing both glass and suspended, discrete, intact particles having some degree of electrical conductivity, applied onto a substrate also having some degree (greater, lesser, or equal) of electrical conductivity. A polymer binder and solvent are chosen, according to the kind of paste or paint desired, and the oxides are thoroughly milled in this binder before the metal particles are added last. The paste or paint is applied thinly to the copper parts by any convenient method (silk-screening, brushing, spraying, transfer tape, etc.). For reasons to be discussed below, the areas of copper to be coated will have been pre-coated with a very thin undercoat film of any metal or alloy that can oxidize in humidified hydrogen. Manganese, chromium and other metals so qualify, but chromium is the most convenient. It can be evaporated, sputtered, diffused, electroplated or electro-less plated onto the copper where needed. A very fine pigment flake of nonmagnetic stainless steel is commercially available and can be painted very thinly ont the copper, and bonded by a brief firing in anhydrous hydrogen, as an alternate approach to providing the required undercoat. In some applications, the substrate is stainless steel rather than copper; in this case no undercoat is needed.

The thickness of the coating which is less than a wavelength, and of the undercoat, can be controlled very easily. Even if the coating shrinks in drying and fusing, it will always do so by the same amount. It is often convenient to inlay the coating into the copper by machining a shallow (a few thousandths of an inch) recess in the copper and filling it level with the paste. AFter the paste or paint has dried in place, the fusing is done in well-humidified hydrogen with a predetermined time and temperature schedule. Any return trips to a wet-hydrogen furnace, at the same or lower temperature, may temporarily soften the formed coating, but do not change its electrical or other properties if the gas remains humidified.

When required to maximize the RF loss index, the metal particles in the coating should have the highest resistivity within the categories of nonmagnetic and magnetic, depending on whether the application isn't or is tolerant of a small amount of magnetic alloy on the cavity walls. In a particularly preferred embodiment, Nichrome V and Type 304 or 316 stainless steel are recommended in the nonmagnetic category; Type 430 stainless steel is recommended in the magnetic category. Kanthal A-1 should be slightly better, but seems to be not readily available in particle form. The dielectric loss tangent of the glass doesn't contribute significantly to the coating's RF dissipation. Rather, the dissipation arises from the circulation of RF currents circumferentially around the perimeters of particles in planes normal to the RF H-field, which penetrates into the coating because the particles don't touch one another to form any barrier.

Smaller particles would provide more layers of particles in a given thickness of coating; wider spacing should permit more H-field penetration but mean less total metal surface per unit volume. This suggests that one could find an optimum value for the fraction of the coating that isn't metal (glass+voids). However, materials availability seems to be one limiting factor: If the finest Nichrome V and Type 430 (magnetic) stainless steel particles available are sifted to 44 microns maximum nominal size (−325 Mesh, the finest sieve in common commercial use) then 0.003 inch is about the thinnest coating it has been found possible to prepare with particles of this sizing. With particles of the pigment flake type, which are under a micron thick, coatings less than 0.0015 inch overall (after processing) have been made, with the flakes orienting themselves within the coating parallel to the copper surface. This flake is regrettably presently unavailable in a magnetic alloy.

Particle shape, spherules or irregular or flakes, may be electrically unimportant unless a dimension is smaller than the alloy's skin depth at the relevant frequency. However in formulating coating mixes it has been convenient to add just enough glass to form a film around each particle, making the proportion of glass dependent on the surface-to-volume ratio of the particles, large spherules requiring considerably less glass than the same weight of very fine flakes. All of the recommended alloys contain chromium which, in humidified hydrogen, quickly oxidizes and becomes highly attractive to molten glass. The glass thus films over the particles and provides adhesion between them and to the substrate. A high percentage of voids are also created (except in the case of the flakes, to which a relatively large amount of glass must be added). The voids make the coatings resilient under any possible thermomechanical stresses. The paucity of voids in the flake-based coatings is unimportant because these coatings are made very thin.

The finished coatings are conveniently machinable (permitting irises to be drilled in a cavity after coating) and repel molten braze alloy. They appear to be DC-insulating under applied voltages of a few volts, but are found to conduct well with a few hundred volts across the coating, in the manner of an amorphous semiconductor. Thus static-charge buildup is not expected to be a problem in tubes, even when electrons might strike the coating. Otherwise a very thin overflash of titanium should be sufficient to solve any charging problem.

SiC or graphite particles might be substituted for stainless steel ones to obtain higher loss indices. However, it has been shown that, while SiC mixtures can have extraordinary high loss, they have a very large effective skin depth. This means that coatings of this kind would have to be so thick they might sometimes be impractical. It has also been established that molten glaze will not bond to SiC or graphite surfaces. Thus, the only way to achieve a coating analogous to the glass-plus-steel ones might be to add ceramic granules to the mixture of SiC or graphite and glaze. The glass/ceramic components would adhere well and might provide a matrix in which the SiC or graphite particles could become trapped.

Important microwave applications (e.g., selective mode damping) are conceivable in which one might want to coat a cavity or waveguide wall such that the loss index for Rf currents flowing in one direction was very much higher than the loss index for RF currents flowing in the orthogonal direction. The following invention, a variant on the glass-plus-stainless-steel-particles coating, should do this job. A thin coating of the same glaze was made with a felt-like collection of long, slender stainless steel fibers in place of the steel particles. The resulting coating had excellent mechanical properties and its loss index was elevated, but not by as much as when powder is used, and isotropic, because the fibers were randomly oriented. By preparing the felt so that the fibers all become oriented parallel to one another, the coating can be made anisotropic. The molten glaze will coat and separate all the fibers and provide cohesion and adhesion of the coating. RF currents flowing parallel to the fibers will simplY flow along them and RF dissipation will be minimal, about the same as for a solid surface of the same (stainless steel) alloy used for the fibers. The corresponding H-field lines are orthogonal to the fibers and will tend not to penetrate deeply into the coating. RF currents flowing normal to the fibers are accompanied by H-field lines parallel to the fibers. These field lines readily penetrate the coating and cause RF currents to flow circumferentially around the fibers, leading to considerable RF dissipation, about the same as for particles of the same alloy and mean diameter and spacing as the fibers. Based on data on hand it's predicted that an anisotropy of 16:1 in loss index (or effective surface resistivity) should be easily obtainable.

Some metal alloy powders used successfully in glass-cemented surface loss coatings are listed below. The upper sizes of the range are estimated from the sieve used while the lower size of the range is from estimates using microscopic measurement.

| Alloy | Magnetic | Particle Shape | Range of Dimensions |
| --- | --- | --- | --- |
| #304 Stainless Steel | No | Irregular | 24 to 44 microns across |
| Nichrome V | No | Roundish Globules | 15 to 44 microns |
| #304 Stainless Steel | Yes | Flakes (made by pounding) | 0.5 micron thick × 20 to 37 microns wide |
| #430 Stainless Steel | Yes | Irregular | 25 to 44 microns |
| Kanthal A-1 (pulverized with our own equipment) | Yes | Irregular | 15 to 37 microns |
| Commercial Alloy = 70% Fe, 25% Cr, 5% Al | Yes | Irregular | 10 to 37 microns also 10 to 25 microns |

A modeling program was conducted to electromagnetically model this coating generically, to understand how the effective surface resistivity gets to be so greatly magnified and how it might depend on frequency, coating thickness, particle size and spacing, etc. to predict and optimize performance in terms of coating parameters.

For purposes of this analysis only, the particles are all assumed to be round and of the same size in a regular, close packed (hexagonal) array (FIG. 1). Definitions include D and L as the particle diameter and center-to-center spacing, respectively; N is the number of apparent layers of particles within the coating thickness (e.g., FIG. 1 shows the case N=4); w is the wavelength. The substrate is taken as of the same alloy as the particles or of a similar alloy. If the substrate is copper it would be plated with a skin depth or more of a resistive alloy, the chromium content of which provides adhesion to the glass.

The plane of the drawing is taken normal to the local RF H-field, and is the plane in which flow the RF currents to be examined. These flow along the substrate and circumferentially around all the particles because the H-field readily penetrates the coating. The model is hereafter taken as two-dimensional, the particles becoming cylindrical wires running parallel to the H-field lines (which surround all the wires).

Dimensions in the plane such as D, L and N.L are all assumed very small compared with wavelength. Particle size, D, is assumed large compared with skin depth, d, for the alloy and frequency of interest. The table below lists skin depth in microns (25.4 microns=0.001 inch) for the nonmagnetic and magnetic alloys of interest at four frequencies. In the latter cases, the symbol m stands for the square root of mu. The apparent mu for Kanthal A-1 and Type 430 stainless steel at 10 GHz is around 8 and 10, respectively (with or without annealing); this perhaps decreases with increasing frequency, but the rate of change isn't known.

|  | 3 GHZ | 10 GHz | 30 GHz | 100 GHz |
| --- | --- | --- | --- | --- |
| Nichrome V | 9.6 | 5.2 | 3.0 | 1.7 |
| St. Steel 304/316 | 7.8 | 4.2 | 2.4 | 1.3 |
| St. Steel 430 | 8.0/m | 4.3/m | 2.5/m | 1.4/m |
| Kanthal A-1 | 11.1/m | 6.0/m | 3.5/m | 1.9/m |

Many Of the metal alloy powders used are sieved to −325 Mesh or 44 microns maximum nominal particle size, with most of the particles in the range 20 to 44 microns. For these powders the assumption of D >> d appears satisfactorily met.

Another material in successful use is a pigment flake of Type 304 or 316 stainless steel with a typical thickness of ½ micron, which is not greater than d for the frequencies of interest. The theory presented here, as it now stands, might apply at best only partially to these flakes.

Because powdered silicon carbide is readily available, and dispersions of it in various ceramics are produced commercially, a dispersion in glass, as a coating, might be considered. However, although the bulk resistivity of this semiconductor is quite variable, the skin depth is inevitably over two orders of magnitude greater than for a resistive metal alloy at the same frequency. Particles of any practical size will certainly be so small compared with d that the analysis presented here should have no relevance at all for SiC-based materials. Moreover a SiC-plus-dielectric mix as a coating would have to be applied so thickly to be effective that a cavity filler rather than a wall coating would be produced.

Figure 2:
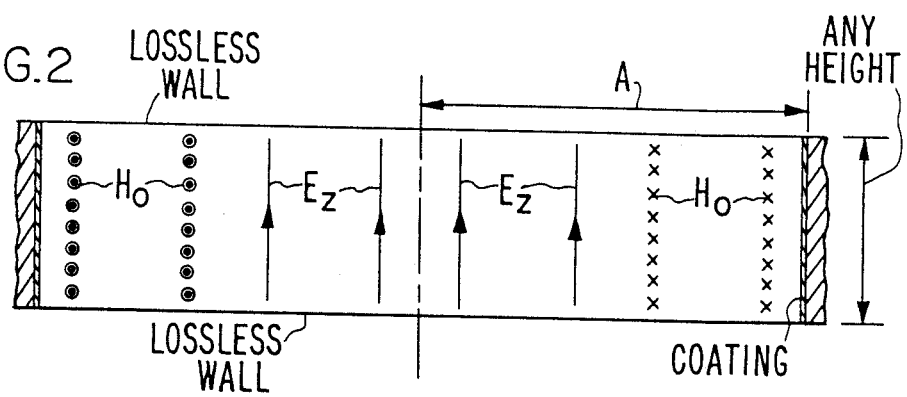
FIG. 2 shows a diagram of a section of an axisymmetric $TM_010$ cavity resonator with lossless end walls used to calculate relative effective loss indices of axisymmetrically configured materials applied to a cylindrical wall.

An axisymmetric pillbox cavity of radius A is assumed (FIG. 2), resonating in the TM10 mode (A=0.383 W). E- and H-field lines are as shown. The flat cavity end walls are taken as lossless, whence the cavity height is immaterial to the unloaded Q, $Q_O$, as well as to the resonance frequency.

Initially the cylindrical wall is smooth, bare metal of the alloy of interest. In this case $$Q_oO = 0.383 \ W_O/d = A/d. \quad (1)$$

(See: Reference Data For Radio Engineers, 4th Edn., I.T.&.T. Corp., New York, 1956, p. 637, FIG. 23, 2nd entry>)

Then the cylindrical wall receives a coating which causes the observed $Q_O$ to drop to $Q_O'$. Therefore, because the flat end walls are lossless here, $$\frac{Q_{OO}}{Q_O'} = \frac{\text{Effect. surf. resistivity with coating}}{\text{Surf. resist. of smooth, same alloy at same freq.}} = LMF \quad (2)$$

where LMF is the Loss Magnification Factor we seek to express the loss effectiveness of pulverizing the alloy and dispersing it in glass rather than leaving it solid.

A basic, conventional assumption is that although significant RF dissipation is occurring overall, cavity fields and currents are essentially the same as if the conductors were perfect. Thus stored energy would be the same in both hypothetical cavities and the ratio $Q_{OO}/QO'$ can be reduced to the ratio of the total $I^2R$ dissipation with coating to that without.

Figure 3A:
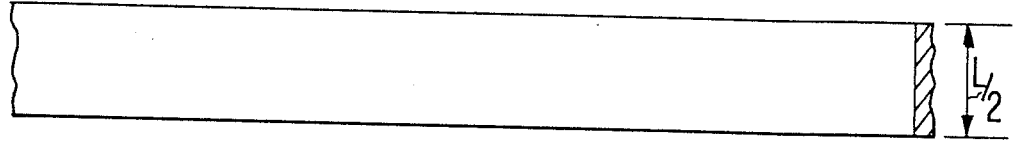
FIG. 3 is an enlargement of a unit slice of the cavity of FIG. 2 in the vicinity of the cylindrical wall.

It is sufficient to evaluate this ratio for unit slices of the same height (L/2) from the two cavities being modeled. FIG. 3 shows these slices with the region close to the cylindrical wall greatly magnified. The particle surfaces, p, and cylindrical wall, s, are of the alloy of interest. All other (flat) surfaces are lossless.

With D << w, L << w and N.L << A, the E-field in the region of FIG. 3 is negligible compared with its values elsewhere in the cavity. The region is one of H-field, which should have the same strength with or without the glass present. The presence of dielectric will henceforth be ignored, and the conclusion tentatively drawn that the electrical properties of the glaze have no significance to the RF loss mechanism.

Yet another simplifying assumption is the familiar one of perturbation theory: that the H-field in the region depicted in FIG. 3 is the same with and without the particles present (as perturbers). Since this crucial assumption may appear rather bold, especially when the fill factor of metal within the coating is large, it will be re-examined later.

Since the region depicted in FIG. 3 adjoins the outer radius of the cavity and is of such small extent relative to that radius, the H-field (which is perpendicular to the plane of the drawing) can be taken as uniform throughout. It thus produces the same current (in the plane of the drawing, and per unit dimension perpendicular to that plane) in any metal surface in the region. One can thus write that for the upper cavity FIG. 3 the [I2R] power dissipated is proportional to L/2. For the lower cavity, the power dissipated is proportional to L/2 +N.pi.D/2. Taking the ratio, $$LMF = 1 + N \cdot pi \cdot D/L.$$

If the cylindrical wall bearing the coating is not of the same alloy as the particles, it is sufficient to change the first term on the right in Eq. (3) from 1 to the surface resistivity of the wall metal divided by that of the particles' metal (e.g., 0.15 for copper wall and 304 stainless steel particles). For N >4 or so it's clear that the choice of substrate metal will matter very little.

Insofar as Eq. 3. is accurate, it states that the Loss Multiplication Factor (as defined previously) depends only on a dimensionless number and geometric ratio There is no dependency on frequency provided D >> d. Neither is there any dependence on particle size, provided particle spacing is scaled in proportion and the number of layers of particles in the coating stays the same.

For N >4 or so, the LMF is essentially simply proportional to N and to the one-dimensional fill factor, D/L (subject to validity of the perturbation concept).

To say that the boost in loss is due to increased surface area happens to be accurate in this case. However, it should be kept clear that the increase is of perimeter in a plane normal to the RF H-field. The effect of increased perimeter in a plane parallel to H is to decrease RF loss.

FIGS. 1 and 3 were drawn for a one-dimensional fill factor D/L=2/3. The likely range of variation of D/L is estimated to be a narrow one, from 0.5 (when the particles are decidedly quite far apart) to 0.8. For these extremes, Eq. (3) yields

| N | LMF (D/L = 0.5) | LMF (D/L = 0.8) |
|---|---|---|
| 4 | 7.3 | 11.0 |
| 6 | 10.4 | 16.1 |
| 8 | 13.6 | 21.0 |
| 10 | 16.7 | 26.1 |

The experimental coating physically most resembling the analytic model was one using Nichrome V particles of somewhat globular shapes with diameters ranging from perhaps 0.0002 to 0.0017 inch (−325 Mesh). Coating thickness was about 0.009 inch. Cross-section micrographs (FIG. 4) are available but it is difficult to gauge average particle size and spacing from them because the variations are considerable. Reasonable estimates are perhaps N=6 or 7 and D/L=0.5 to 0.6. These give LMF =10 to 14, using Eq. 3. The experimentally measured LMF was about 13. To the extent permitted by this single, limited comparison, Eq. 3 appears to be validated.

Figure 3B:
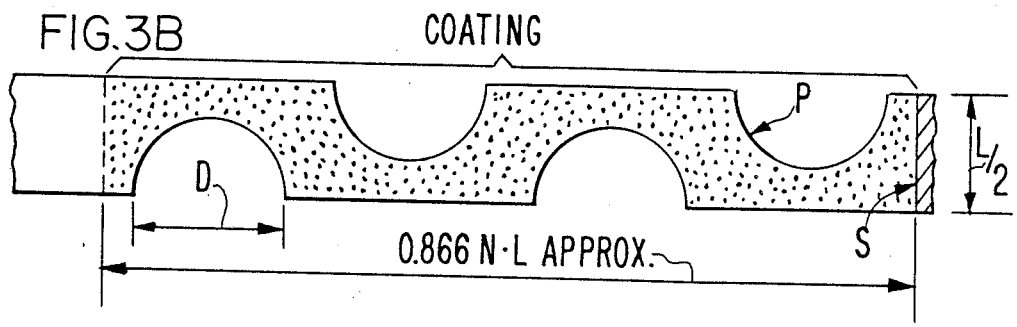

The assumption at issue is the one that states that the H-field just inside the cylindrical wall of the cavity and the associated current on any metal surface in the region are the same with and without the coating of particles and dielectric (lower and upper drawings in FIG. 3). As another way of examining this, let the zigzag, dielectric-loaded coating region slice of FIG. 3B be redrawn as in FIG. 5A. The main cavity now has a tiny radial extension in the amount of delta.A with reduced height $h_x$. Define $$u = \text{delta·}A/A \text{ and } v = h_x/h_O.$$

The fraction u would be of the order of 0.01 and the fraction v in the range of 0.2 to 0.8.

The main cavity has an equivalent circuit comprising inductance $L_O$ and capacitance $C_O$ in FIG. 5B. The elements representing the radial extension are $C_x$ and $L_x$ such that $$L_x/L_O = u \cdot v \text{ and } C_x/C_O = E_R \, u/v$$

where $E_R$ is the effective relative dielectric constant of the glass and voids in the coating. (See: G. L. Matthei et al., Microwave Filters, Impedance-Matching Networks, and Coupling Structures, McGraw-Hill Book Co., New York, 1964.)

Evaluating the resonance frequencies of $L_x$ with $C_x$ and $L_O$ with $C_O$ and taking the ratio gives as a result that the $C_x$-$L_x$ resonance is higher in frequency than the $C_O$-$L_O$ resonance by the ratio $$F_x/F_O = (u)^{-1}(E_r)^{-1/2}$$

which would be of the order of 50. Since the frequencies of actual interest are in the vicinity of the main-cavity resonance, $F_O$, so much below $F_x$, the reactance of $C_x$ would be very large relative to the reactance of $L_x$. This makes the current through Lx very nearly the same as the current through $L_O$, or in other words the current in the little radial extension is substantially the same as the current in the main cavity slice immediately adjacent. Moreover this would remain true regardless of the packing density and dielectric parameters in the coating, provided the particles don't touch and the relative effective dielectric constant is less than 10 or so (and also provided one isn't dealing with extremely thick coatings and short wavelengths).

In summary, this alternative analysis approach avoids any dilemma in assuming the particles are only small perturbers even at high packing density, and in ignoring the dielectric. Instead the coating portion at the outer radius of the cavity slice is examined to identify a capacitance and inductance associated with the particle layers and dielectric. If, whatever the packing density, coating thickness and dielectric, the associated resonance frequency is very large compared with the operating frequency, the reactance of the indicated capacitance has negligible effect and currents are the same on all metal surfaces in and adjoining the coating region.

The following examples are presented to illustrate but not limit the invention.

EXAMPLE 1

Preparation Of A Glass Paste

A glass paste was prepared as follows:

TABLE

| Component | Amount |
|---|---|
| $B_2O_3$ | 79.9 g |
| $Al_2O_3$ | 56.2 g |
| $SiO_2$ | 139.1 g |
| MnO | 316.7 g |

The above components were mixed with 270.6 g of a liquid consisting of 247.7 g butyl Carbitol (diethyleneglycol-monobutyl ether) in which 22.9 g of a methacrylate acrylic polymer is dissolved. This preparation (also referred to herein as a mill base) is then added to a ball mill containing grinding media, e.g. ceramic balls such as DIAMONITE to obtain a smooth-textured and intimately mixed homogenous paste. The paste was subjected to roller milling for about 6 days and a viscous, stiff paste resulted. An additional 48 g of Butyl Carbitol solvent was added to adjust the viscosity and milling was continued for a few more days.

This recipe is essentially the same as is commonly used for metallizing. However, $B_2O_3$ was added to lower the melting point from 1280° C. to 1040° C. (as used herein, the "melting point" is only nominal, since glass is really a liquid in any temperature. The temperatures identified refer to the center of the range of temperatures over which the original oxide powders satisfactorily turn into glass).

This basic glass paste can be used in mixtures which are to be applied by knife, spatula, brush or silk screen. The following examples illustrate the preparation of the coating composition of this invention wherein this basic glass paste is employed.

EXAMPLE 2

A coating composition was prepared comprising 27.8 g of the basic glass paste of example 1 and 10 g of a pigment flake grade powdered stainless steel Alloy 304-L. 2.8 g of Butyl Carbitol was added to the mix. The components were thoroughly mixed by stirring.

The resultant composition is suitable for use in thin coatings of the invention, e.g., 0.001 inches to 0.005 inches, measured after firing, on, small waveguide/- cavity parts, especially where magnetic materials are best avoided.

EXAMPLE 3

A coating composition was prepared comprising 6.4 g of basic glass paste and 25 g of powdered NICHROME V sieved to obtain −325 mesh (particle shape, approximately spherical). 0.8 g of supplemental Butyl Carbitol was added to adjust viscosity. The components were thoroughly mixed by stirring.

The resulting composition is suitable for use in thicker coatings, e.g. 0.005 to 0.010 inches measured after firing, on larger waveguide/cavity parts, where magnetic materials must be avoided.

EXAMPLE 4

A coating composition was prepared comprising 18.0 g of basic glass paste and 50.0 g of powdered stainless steel Alloy 430-L sieved to obtain −325 mesh (particle shape irregular). 2.3 g of supplemental Butyl Carbitol was employed to adjust the viscosity. The components were thoroughly mixed by stirring.

The resulting composition is suitable for use in the applications of Example 3, except that the application should be such that magnetic materials are permissible and the consequently higher RF absorbility is desirable.

The formulations of Examples 2-4 can be expressed in terms of weight ratios among the four glass-forming oxides and the metal component. These ratios can be used to derive the weight ratio of glass to metal in the final, fired coating. This ratio can be optimized by considering the total surface of the metal particles being used. A given weight of metal will have the least surface if the metal particles are large spheres but the most surface if they are ultra-thin flakes. The optimum compositions are those wherein just enough glass is present to provide each particle with a thin film of glass. If the metal component is in flake form all of the flakes can be disposed parallel to each other and tightly packed so that large voids in the glass are not present, although relatively large amounts of glass are required to form a film over the surfaces of each particle. Thus, it can be seen once the optimum weight ratio of metal and glass is determined for a particular shape and size of metal particle, the particular solvents and polymer employed are not critical. Thus, many different polymers and solvents can be employed and the viscosity of the coating composition can be adjusted to suit the method of application. For example, a relatively highly viscous composition can be employed for silk screen application and a relatively fluid composition can be employed for spray painting.

Evaluation of Effectiveness of Coatings in Inducing RF Loss

In the following examples the degree to which the coatings of this invention increase RF power loss was measured by placing samples of representative compositions which were applied to a substrate and fired, in an electromagnetic resonant cavity tuned to about 10.5 GHz. The cavity and test procedures are disclosed "Microwave Physics of Flame-Sprayed Kanthal and Other Circuit Loss Coatings," A. Karp, pages 354 to 356, 1985 *IEDM Technical Digest*, IEEE, the entirety of which disclosure is incorporated by reference herein. The samples were prepared using the coating compositions of Examples 2-4. The compositions were spread on a copper substrate with a spatula using a mask such that a circular test patch having a diameter of 1.04 inches was obtained. The copper substrate later became part of the test cavity as discussed in the Karp publication cited above.

Prior to applying the coating to the substrate an undercoat was applied to act as an interface between the coating and the copper base. The undercoat was prepared by applying a layer of Alloy 340-L pigment-flake-grade powdered stainless steel mixed with a solvent and binder. The undercoat mixture was brushed on in the area of the test patch and fired at about 1000° C. in dry hydrogen for about 15 minutes. The undercoat had a thickness between 0.0005 and 0.001 inches after this initial sintering. The coating material being evaluated was then spread on the undercoating in the form of a circular test patch using a mask and spatula. Once the layer was applied, it was air-dried at a temperature of 300° C. for about ½ hour. The layer was then fired at a temperature of about 1040° C. in wet hydrogen (i.e., humidified hydrogen) for about 15 minutes using a pusher oven. In all cases, the test patch thickness, inclusive of the undercoat before drying and firing was 0.007 inches. In all cases, the test patch diameter was 1.04 inches.

After firing the layer is placed in the resonant cavity and subjected to RF energy as described in the Karp publication discussed above. A particular mode of resonance is employed and it is insured that this is the only mode excited and observed. As disclosed in the Karp publication, the paths of currents on the surfaces of the flat walls are concentric circles.

Prior to applying the test patch coating and undercoat the resonant cavity is entirely copper. The cavity Q is then measured and compared with the Q which can be readily calculated for such an all-copper cavity. This verifies that the standard formula provides an accurate model for the testing cavity. These calculations are fully conventional and well known to those of ordinary skill in the art and are discussed more fully in the Karp publication discussed above.

Since the coating compositions of the invention absorbed RF energy the Q measured with the patch present is smaller than in its absence. Since the diameter of the patch is known the Q data can readily be mathematically processed to express the RF absorbility of the coating relative to that of the copper on which it lies. This ratio is referred to herein in the following examples as the loss index. The compositions of examples 2-4 were tested using the above procedures to determine their loss indices.

EXAMPLE 5

A test patch was prepared as discussed above using the coating composition of example 2. The thickness of the coating after drying and firing was about 0.0025 inch inclusive of the undercoat. The measured loss index of the coating was 100 +/−5%.

EXAMPLE 6

A test patch was prepared using the coating composition of example 3. The thickness of the coating after drying and firing was about 0.0065 inch including the undercoat. The measured loss index of the coating was 100 +/−5%.

EXAMPLE 7

A test patch was prepared using the coating composition of example 4. The thickness of the test patch after drying and firing was about 0.006 inch, including the undercoat. The loss index of the coating was 290 +/−5%.

The invention is not limited to the preferred embodiment and alternatives heretofore described, to which variations and improvements may be made including mechanically and electrically equivalent modifications to component parts, without departing from the scope of protection of the present patent and true spirit of the invention, the characteristics of which are summarized in the following claims.

What is claimed is:

1. A coated article, useful as a microwave circuit element which displays a high radio frequency surface power loss, comprising:
a conductive metal surface which has a single layer coating comprising a suspension of metal particles held in a vitreous dielectric binder such that each particle is substantially surrounded by a film of the binder in a manner such that the particles do not contact one another, said particles being smaller than the thickness of the coating but no smaller than about one quarter of the skin depth at microwave frequencies and said coating being less than about one wavelength thick at said frequencies.

2. The coated article of claim 1 wherein the metal particles contain sufficient chromium that after oxidation in humidified hydrogen they are highly attractive to molten glass.

3. The coated article of claim 1 wherein the particles are fibrous and oriented substantially parallel to each other.

4. The coated article of claim 1 wherein the coating has a thickness between about 0.001 to 0.001 inches.

5. A coated article of claim 1 wherein said conductive metal surface is a waveguide component.

6. A coated article useful as a microwave circuit element which displays a high radio frequency surface power loss comprising:
a conductive metal surface which is coated with a suspension of resistive particles comprising silicon carbide held in a glassy dielectric binder such that the particles do not touch one another, said particles being smaller than the thickness of the coating but not smaller than one-quarter of the skin depth in silicon carbide at the frequency at which the element is to function and said coating having a thickness less than about one wavelength at said operating frequency.

7. A coated article of claim 6 wherein said conductive metal surface is a waveguide component.

8. A coated article useful as a microwave circuit element which displays a high radio frequency surface power less comprising:
a conductive metal surface which is coated with a suspension of resistive particles comprising graphite held in a glassy dielectric binder such that the particles do not touch one another, said particles being smaller than the thickness of the coating but not smaller than one-quarter of the skin depth in graphite at the frequency at which the element is to function and said coating having a thickness less than about one wavelength at said operating frequency.

9. The coated article of claim 1, 6 or 8 wherein the conductive metal surface is copper.

10. The coated article of claim 9 wherein the copper surface has been treated with a primer undercoat of a metal which will oxidize in humidified hydrogen.

11. A coated article useful as a microwave circuit element which displays a high radio frequency surface power loss obtained by
coating the surface of a high-conductivity substrate metal to a thickness such that the ultimately formed coating will be less than one wavelength thick at the frequency at which the element is to function with a viscous suspension of glass forming frit and metal particles, said particles being smaller than the ultimate thickness of the coating but no smaller than one quarter of the skin-depth at said operating frequency and containing sufficient chromium that after oxidation in humidified hydrogen they are highly attractive to molten glass; and
drying the coating and firing the glass forming frit under humidified hydrogen such that each metal particle is coated with a film of glass and is kept from contact with the other metal particles.

12. A coated article of claim 11 wherein said conductive metal surface is a waveguide component.

13. A coated article useful as a microwave circuit element which displays a high radio frequency surface power loss comprising
a conductive metal surface which has a single layer coating comprising a suspension of metal particles held in a vitreous dielectric binder which includes an oxide of an element selected from the group consisting of aluminum, silicon, manganese and boron in such a manner that each particle is sufficiently surrounded by a film of the binder that the particles do not contact one another, said particles being smaller than the thickness of the coating but no smaller than about one quarter of the skin depth at microwave frequencies and said coating being less than about one wavelength thick at said frequencies.

14. A coated particle useful as a microwave circuit element which displays a high radio frequency surface power loss comprising
a conductive metal surface which as a single layer coating comprising a suspension of metal particles held in a vitreous dielectric binder which includes an oxide of an element selected from the group consisting of aluminum, silicon, manganese and boron in such a manner that each particle is sufficiently surrounded by a film of the binder that the particles do not contact one another, said particles being smaller than the thickness of the coating but no smaller than about one quarter of the skin depth at microwave frequencies and said coating being between about 0.001 and 0.01 inches thick.

15. A coated particle useful as a microwave circuit element which displays a high radio frequency surface power loss comprising
a conductive metal surface which as a single layer coating comprising a suspension of metal particles wherein these particles include a metal selected from the group consisting of iron, nickel, chromium and mixtures thereof held in a vitreous binder in such a manner that each particle is sufficiently surrounded by a film of the binder that the particles do not contact one another, said particles being smaller than the thickness of the coating but no smaller than about one quarter of the skin depth at microwave frequencies and said coating being between about 0.001 and 0.01 inches thick.

16. The coated article of claim 15 wherein the metal particles comprise an alloy selected from the group consisting of Nichrome V, Type 304 ; stainless steel, Type 316 stainless steel, Type 430 stainless steel and Kanthal A1.

* * * * *

UNITED STATES PATENT AND TRADEMARK OFFICE
CERTIFICATE OF CORRECTION

PATENT NO. : 4,971,856

DATED : November 20, 1990

INVENTOR(S) : Karp et al

It is certified that error appears in the above-identified patent and that said Letters Patent is hereby corrected as shown below:

On the title page, please insert item [73] as follows:

--Assignee: --Varian Associates, Inc.--

Signed and Sealed this

Twenty-sixth Day of January, 1993

Attest:

STEPHEN G. KUNIN

*Attesting Officer*  *Acting Commissioner of Patents and Trademarks*